(12) United States Patent
Kubena

(10) Patent No.: US 10,110,198 B1
(45) Date of Patent: Oct. 23, 2018

(54) INTEGRATED QUARTZ MEMS TUNING FORK RESONATOR/OSCILLATOR

(71) Applicant: HRL Laboratories, LLC, Malibu, CA (US)

(72) Inventor: Randall L. Kubena, Oak Park, CA (US)

(73) Assignee: HRL Laboratories, LLC, Malibu, CA (US)

( * ) Notice: Subject to any disclaimer, the term of this patent is extended or adjusted under 35 U.S.C. 154(b) by 284 days.

(21) Appl. No.: 14/973,701

(22) Filed: Dec. 17, 2015

(51) Int. Cl.
| | |
|---|---|
| *H03H 9/215* | (2006.01) |
| *H01L 41/047* | (2006.01) |
| *H01L 41/09* | (2006.01) |
| *H01L 41/18* | (2006.01) |
| *H03H 9/125* | (2006.01) |
| *H03H 3/02* | (2006.01) |

(52) U.S. Cl.
CPC .............. *H03H 9/215* (2013.01); *H03H 3/02* (2013.01); *H03H 9/125* (2013.01); *H03H 2003/026* (2013.01)

(58) Field of Classification Search
CPC ........... H03H 9/215; H03H 3/02; H03H 9/125
USPC ......................................... 310/365, 366, 370
See application file for complete search history.

(56) References Cited

U.S. PATENT DOCUMENTS

| | | | |
|---|---|---|---|
| 392,650 A | 11/1888 | Watrous | |
| 3,766,616 A | 10/1973 | Staudte | |
| 3,969,641 A * | 7/1976 | Oguchi | G04F 5/063 310/348 |
| 4,005,321 A * | 1/1977 | Shibata | G04F 5/063 310/348 |
| 4,178,566 A * | 12/1979 | Kawashima | G04F 5/063 310/361 |
| 4,349,763 A * | 9/1982 | Hoshi | H03H 9/215 310/315 |
| 4,364,016 A | 12/1982 | Tanski | |

(Continued)

FOREIGN PATENT DOCUMENTS

| | | |
|---|---|---|
| DE | 44 42 033 | 5/1996 |
| DE | 19719601 | 11/1998 |

(Continued)

OTHER PUBLICATIONS

Abe et al., "One-chip multichannel quartz crystal microbalance (QCM) fabricated by Deep RIE," *Sensors and Actuators*, vol. 82, pp. 139-143 (2000).

(Continued)

*Primary Examiner* — Thomas Dougherty
(74) *Attorney, Agent, or Firm* — Ladas & Parry

(57) ABSTRACT

A piezoelectric quartz tuning fork resonator having a pair of tines formed from a common quartz plate, with a middle electrode and two outer electrodes being disposed at or on top and bottom surfaces of each of the pair of tines and interconnected such that the outer electrodes at or on the top and bottom surfaces of a first one of the pair of tines are connected in common with the middle electrodes on the top and bottom surfaces of a second one of the pair of tines and further interconnected such that the outer electrodes at or on the top and bottom surfaces of the second one of the pair of tines are connected in common with the middle electrodes on the top and bottom surfaces of the first one of the pair of tines.

9 Claims, 7 Drawing Sheets

(56) References Cited

U.S. PATENT DOCUMENTS

| | | | |
|---|---|---|---|
| 4,426,769 A | 1/1984 | Grabbe | |
| 4,442,574 A | 4/1984 | Wanuga et al. | |
| 4,472,655 A * | 9/1984 | Kawashima | H03H 9/215 |
| | | | 310/270 |
| 4,507,970 A * | 4/1985 | Dinger | G01L 9/0022 |
| | | | 310/312 |
| 4,618,262 A | 10/1986 | Maydan et al. | |
| 4,655,081 A | 4/1987 | Burdess | |
| 4,870,313 A | 9/1989 | Hirama et al. | |
| 4,898,031 A | 2/1990 | Oikawa et al. | |
| 4,944,836 A | 7/1990 | Beyer et al. | |
| 5,203,208 A | 4/1993 | Bernstein | |
| 5,226,321 A | 7/1993 | Varnham et al. | |
| 5,260,596 A | 11/1993 | Dunn et al. | |
| 5,261,277 A | 11/1993 | Thomas et al. | |
| 5,421,312 A | 6/1995 | Dawson | |
| 5,480,747 A | 1/1996 | Vasudev | |
| 5,552,016 A | 9/1996 | Ghanayem | |
| 5,578,976 A | 11/1996 | Yao et al. | |
| 5,589,724 A | 12/1996 | Satoh et al. | |
| 5,604,312 A | 2/1997 | Lutz | |
| 5,605,490 A | 2/1997 | Laffey et al. | |
| 5,644,139 A | 7/1997 | Allen et al. | |
| 5,646,346 A | 7/1997 | Okada | |
| 5,648,849 A | 7/1997 | Canteloup et al. | |
| 5,658,418 A | 8/1997 | Coronel et al. | |
| 5,665,915 A | 9/1997 | Kobayashi et al. | |
| 5,666,706 A | 9/1997 | Tomita et al. | |
| 5,668,057 A | 9/1997 | Eda et al. | |
| 5,728,936 A | 3/1998 | Lutz | |
| 5,783,749 A | 7/1998 | Lee et al. | |
| 5,894,090 A | 4/1999 | Tang et al. | |
| 5,905,202 A | 5/1999 | Kubena et al. | |
| 5,920,012 A | 7/1999 | Pinson | |
| 5,928,532 A | 7/1999 | Koshimizu et al. | |
| 5,942,445 A | 8/1999 | Kato et al. | |
| 5,981,392 A | 11/1999 | Oishi | |
| 5,987,985 A | 11/1999 | Okada | |
| 6,009,751 A | 1/2000 | Ljung | |
| 6,044,705 A | 4/2000 | Neukermans et al. | |
| 6,081,334 A | 6/2000 | Grimbergen et al. | |
| 6,094,985 A | 8/2000 | Kapels et al. | |
| 6,145,380 A | 11/2000 | MacGugan | |
| 6,151,964 A | 11/2000 | Nakajima | |
| 6,155,115 A | 12/2000 | Ljung | |
| 6,164,134 A | 12/2000 | Cargille | |
| 6,182,352 B1 | 2/2001 | Deschenes et al. | |
| 6,196,059 B1 | 3/2001 | Koesslinger et al. | |
| 6,207,008 B1 | 3/2001 | Kijima | |
| 6,250,157 B1 | 6/2001 | Touge | |
| 6,263,552 B1 | 7/2001 | Takeuchi et al. | |
| 6,282,958 B1 | 9/2001 | Fell et al. | |
| 6,289,733 B1 | 9/2001 | Challoner et al. | |
| 6,297,064 B1 | 10/2001 | Koshimizu | |
| 6,349,597 B1 | 2/2002 | Folkmer et al. | |
| 6,367,326 B1 | 4/2002 | Okada | |
| 6,367,786 B1 | 4/2002 | Gutierrez et al. | |
| 6,413,682 B1 | 7/2002 | Shibano et al. | |
| 6,417,925 B1 | 7/2002 | Naya | |
| 6,424,418 B2 | 7/2002 | Kawabata et al. | |
| 6,426,296 B1 | 7/2002 | Okojie | |
| 6,432,824 B2 | 8/2002 | Yanagisawa | |
| 6,481,284 B2 | 11/2002 | Geen et al. | |
| 6,481,285 B1 | 11/2002 | Shkel et al. | |
| 6,492,195 B2 | 12/2002 | Nakanishi et al. | |
| 6,513,380 B2 | 2/2003 | Reeds et al. | |
| 6,514,767 B1 | 2/2003 | Nathan | |
| 6,515,278 B2 | 2/2003 | Wine et al. | |
| 6,584,845 B1 | 7/2003 | Gutierrez et al. | |
| 6,614,529 B1 | 9/2003 | Tang | |
| 6,621,158 B2 | 9/2003 | Martin et al. | |
| 6,627,067 B1 | 9/2003 | Branton et al. | |
| 6,628,177 B2 | 9/2003 | Clark et al. | |
| 6,629,460 B2 | 10/2003 | Challoner | |
| 6,651,027 B2 | 11/2003 | McCall et al. | |
| 6,661,162 B1 * | 12/2003 | Nagai | H03H 3/02 |
| | | | 310/340 |
| 6,715,352 B2 | 4/2004 | Tracy | |
| 6,756,304 B1 | 6/2004 | Philippe | |
| 6,796,179 B2 | 9/2004 | Bae et al. | |
| 6,806,557 B2 | 10/2004 | Ding | |
| 6,815,228 B2 | 11/2004 | Usui et al. | |
| 6,856,217 B1 | 2/2005 | Clark et al. | |
| 6,883,374 B2 | 4/2005 | Fell et al. | |
| 6,933,164 B2 | 8/2005 | Kubena | |
| 6,985,051 B2 | 1/2006 | Nguyen et al. | |
| 7,118,657 B2 | 10/2006 | Golovchenko et al. | |
| 7,152,290 B2 | 12/2006 | Junhua et al. | |
| 7,168,318 B2 | 1/2007 | Challoner et al. | |
| 7,237,315 B2 | 7/2007 | Kubena et al. | |
| 7,459,099 B2 | 12/2008 | Kubena et al. | |
| 7,543,496 B2 | 6/2009 | Ayazi et al. | |
| 7,555,824 B2 | 7/2009 | Chang et al. | |
| 7,559,130 B2 | 7/2009 | Kubena et al. | |
| 7,647,688 B1 | 1/2010 | Chang et al. | |
| 7,750,535 B2 | 7/2010 | Kubena et al. | |
| 7,830,074 B2 | 11/2010 | Kubena et al. | |
| 7,884,930 B2 | 2/2011 | Kirby et al. | |
| 8,176,607 B1 | 5/2012 | Kubena et al. | |
| 8,373,334 B2 * | 2/2013 | Aratake | H03H 3/04 |
| | | | 29/25.35 |
| 8,765,615 B1 | 7/2014 | Chang et al. | |
| 9,822,286 B2 * | 11/2017 | Fornof | C09J 135/02 |
| 2002/0066317 A1 | 6/2002 | Lin | |
| 2002/0072246 A1 | 6/2002 | Goo et al. | |
| 2002/0074947 A1 | 6/2002 | Tsukamoto | |
| 2002/0107658 A1 | 8/2002 | McCall et al. | |
| 2002/0185611 A1 | 12/2002 | Menapace et al. | |
| 2002/0185939 A1 * | 12/2002 | Aratake | H01L 41/053 |
| | | | 310/348 |
| 2003/0003608 A1 | 1/2003 | Arikado et al. | |
| 2003/0010123 A1 | 1/2003 | Malvern et al. | |
| 2003/0029238 A1 | 2/2003 | Challoner | |
| 2004/0055380 A1 | 3/2004 | Shcheglov et al. | |
| 2004/0065864 A1 | 4/2004 | Vogt et al. | |
| 2004/0132310 A1 | 7/2004 | Nakatani et al. | |
| 2004/0189311 A1 | 9/2004 | Glezer et al. | |
| 2004/0211052 A1 | 10/2004 | Kubena et al. | |
| 2004/0239341 A1 | 12/2004 | Aoyagi et al. | |
| 2005/0156309 A1 | 7/2005 | Fuji et al. | |
| 2005/0260792 A1 | 11/2005 | Patel et al. | |
| 2006/0016065 A1 | 1/2006 | Nagaura | |
| 2006/0213266 A1 | 9/2006 | French et al. | |
| 2006/0252906 A1 | 11/2006 | Godschalx et al. | |
| 2007/0017287 A1 | 1/2007 | Kubena et al. | |
| 2007/0205839 A1 | 9/2007 | Kubena et al. | |
| 2007/0220971 A1 | 9/2007 | Ayazi et al. | |
| 2008/0034575 A1 | 2/2008 | Chang et al. | |
| 2008/0036335 A1 | 2/2008 | Naito et al. | |
| 2008/0074661 A1 | 3/2008 | Zhang et al. | |
| 2008/0096313 A1 | 4/2008 | Patel et al. | |
| 2008/0148846 A1 | 6/2008 | Whelan et al. | |
| 2009/0189294 A1 | 7/2009 | Chang et al. | |
| 2010/0000324 A1 | 1/2010 | Yoshikawa et al. | |
| 2010/0020311 A1 | 1/2010 | Kirby et al. | |
| 2010/0314969 A1 | 12/2010 | Gaidarzhy et al. | |
| 2012/0224460 A1 * | 9/2012 | Aratake | H03H 9/1021 |
| | | | 368/47 |
| 2012/0242194 A1 * | 9/2012 | Kikushima | H01L 41/04 |
| | | | 310/348 |
| 2013/0104653 A1 | 5/2013 | Bernstein et al. | |
| 2013/0214461 A1 | 8/2013 | Shkel et al. | |
| 2013/0221808 A1 * | 8/2013 | Morimoto | H03H 3/02 |
| | | | 310/366 |
| 2015/0000401 A1 | 1/2015 | Perahia et al. | |

FOREIGN PATENT DOCUMENTS

| | | |
|---|---|---|
| EP | 0 461 761 | 12/1991 |
| EP | 0531985 A1 | 3/1993 |
| EP | 1055908 | 11/2000 |
| EP | 0 971 208 | 12/2000 |
| JP | 57-091017 | 6/1982 |

(56) References Cited

FOREIGN PATENT DOCUMENTS

| | | |
|---|---|---|
| JP | 401129517 | 5/1989 |
| JP | 04322507 A | 11/1992 |
| JP | 05286142 A | 11/1993 |
| JP | 08330878 | 12/1996 |
| JP | 2005180921 A | 7/2005 |
| KR | 1020010110428 A | 12/2001 |
| WO | 96/38710 | 12/1996 |
| WO | 98/15799 | 4/1998 |
| WO | 00/68640 | 11/2000 |
| WO | 01/44823 | 6/2001 |
| WO | 01/74708 | 10/2001 |
| WO | 02/12873 | 2/2002 |
| WO | 2005/121769 | 12/2005 |
| WO | 2006/010206 | 2/2006 |
| WO | 2006/103439 | 10/2006 |

OTHER PUBLICATIONS

Barbour et al., "Micromechanical Silicon Instrument and Systems Development at Draper Laboratory," AIAA Guidance Navigation and Control Conference, 1996, Paper No. 96-3709.

Cleland, A.N. et al., "Fabrication of high frequency nanometer scale mechanical resonators from bulk Si crystals," Appl. Phys. Lett., vol. 69, No. 18, pp. 2653-2655 (Oct. 28, 1996).

Evoy et al., "Temperature-dependent internal friction in silicon nanoelectromechanical systems," Applied Phyics Letters, vol. 77, No. 15, pp. 2397-2399 (Oct. 9, 2000).

Fujita et al., "Disk-shaped bulk micromachined gyroscope with vacuum sealing," Sensors and Actuators A:Physical, vol. 82, pp. 198-204, (May 2000).

Greer, J.A. et al., "Properties of SAW resonators fabricated on quartz substrates of various qualities," Ultrasonics Symposium, IEEE Proceedings 1994, vol. 1, pp. 31-36, (Nov. 1-4, 1994).

Griffiths, David J., *Introduction to Electrodynamics.* Saddle River: Prentice Hall, pp. 179-196, (1999).

Johnson et al., "Surface Micromachined Angular Rate Sensor," A1995 SAE Conference, Paper No. 950538, pp. 77-83, (Feb. 27-Mar. 2, 1995).

Kuhns, Design and Fabrication of a Micromechanical Gyroscope Thesis, Jun. 17, 1996, Pertinent Section: Chapter 5.

Kwan, H. Lee, T.G. in "Cooling and control of a cavity opto-electromechanical system," *Phys, Rev. Lett.*, vol. 104, pp. 1-4, 123604 2010.

Putty et al., "A Micromachined Vibrating Ring Gyroscope," Solid State Sensor and Actuator Workshop, Transducer Research Foundation, Hilton Head, 1994, pp. 213-220.

Sirbuly et al., "Multifunctional Nanowire Evanescent Wave Optical Sensors," *Advanced Materials*, (published online: Dec. 5, 2006), pp. 61-66, (2007).

Skulski et al., "Planar resonator sensor for moisture measurements," Microwaves and Radar, 1998, Mikon '98, 12th International Conf., vol. 3, pp. 692-695, (May 20-22, 1998).

Tang et al., "A Packaged Silicon MEMS Vibratory Gyroscope for Microspacecraft," Proceedings IEEE, 10th Annual Int. Workshop on MEMS, Japan, 1997, pp. 500-505.

Tang et al., "Silicon Bulk Micromachined Vibratory Gyroscope," *Jet Propulsion Lab.*

Unterreithmeier, Q.P., Eig, E.M., & Kotthaus, J.P. in "Universal transduction scheme for nanomechanical systems based on dielectric forces," *Nature*, vol. 458, pp. 1001-1003, 2009.

White et al., "Increasing the Enhancement of SERS with Dielectric Microsphere Resonators," *Spectroscopy-Eugene*, (Apr. 2006).

Wright et al., "The HRG Applied to a Satellite Attitude Reference System," Guidance and Control, AASAAS, 86:55-67, (1994).

Yan et al., "Surface-enhanced Raman scattering (SERS) detection for chemical and biological agents," *IEEE Sensors Journal*, vol. 5, No. 4, (Aug. 2005).

Zhiyong et al., "Ultra-Low Noise Charge Sensitive Amplifier for MEMS Gyroscope," 2009 *Fifth International Conference on MEMS NANO, and Smart Systems*, pp. 29-32, (2009).

U.S. Appl. No. 11/800,294 (Now U.S. Pat. No. 7,750,535), Non-Final Rejection dated Jul. 29, 2009.

U.S. Appl. No. 11/800,294 (Now U.S. Pat. No. 7,750,535), Notice of Allowance dated Nov. 30, 2009.

U.S. Appl. No. 12/189,617 (Now U.S. Pat. No. 7,647,688), Restriction/Election dated Apr. 13, 2009.

U.S. Appl. No. 12/189,617 (Now U.S. Pat. No. 7,647,688), Notice of Allowance dated Sep. 3, 2009.

U.S. Appl. No. 12/575,634 (Now U.S. Pat. No. 8,176,607), Requirement/Election dated Mar. 23, 2011.

U.S. Appl. No. 12/575,634 (Now U.S. Pat. No. 8,176,607), Requirement/Election dated Jul. 11, 2011.

U.S. Appl. No. 12/575,634 (Now U.S. Pat. No. 8,176,607), Ex Parte Quayle Action mailed on Oct. 17, 2011.

U.S. Appl. No. 12/575,634 (Now U.S. Pat. No. 8,176,607), Notice of Allowance dated Jan. 9, 2012.

U.S. Appl. No. 12/816,292 (Now U.S. Pat. No. 8,765,615), Non-Final Rejection dated Aug. 9, 2012.

U.S. Appl. No. 12/816,292 (Now U.S. Pat. No. 8,765,615), Final Rejection dated Dec. 14, 2012.

U.S. Appl. No. 12/816,292 (Now U.S. Pat. No. 8,765,615), Non-Final Rejection dated Oct. 18, 2013.

U.S. Appl. No. 12/816,292 (Now U.S. Pat. No. 8,765,615), Notice of Allowance dated Feb. 24, 2014.

U.S. Appl. No. 13/930,769 (Now published as 2015/0000401), Non-Final Rejection dated Jul. 20, 2015.

U.S. Appl. No. 13/930,769 (Now published as 2015/0000401), Final Rejection dated Nov. 4, 2015.

U.S. Appl. No. 13/930,769 (Now published as 2015/0000401), Non-Final Rejection dated Mar. 10, 2016.

* cited by examiner

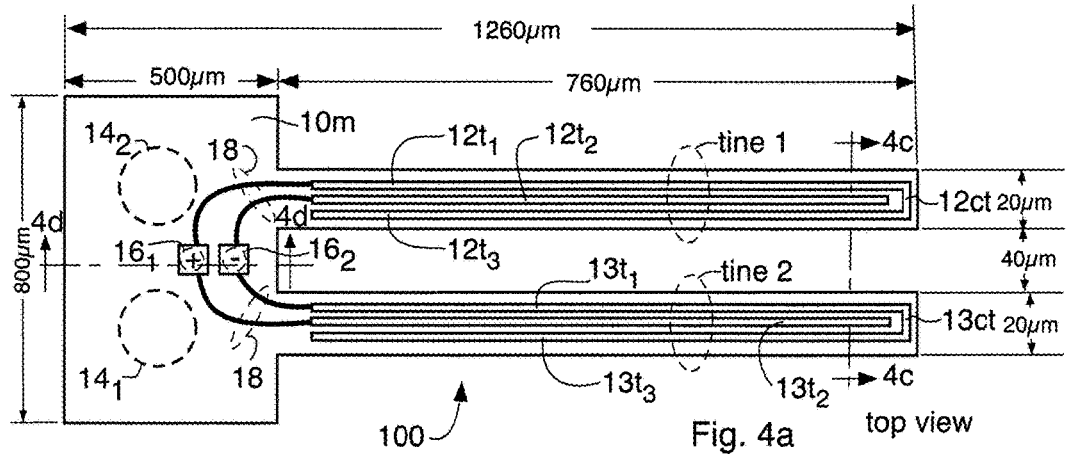
Fig. 4a top view
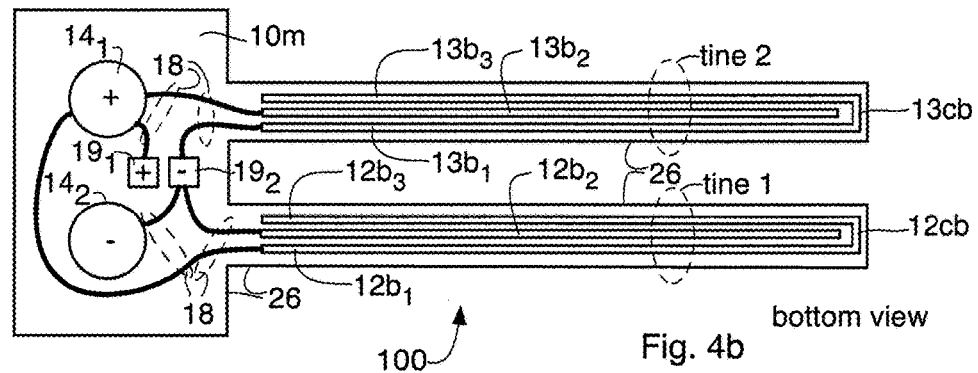
Fig. 4b bottom view
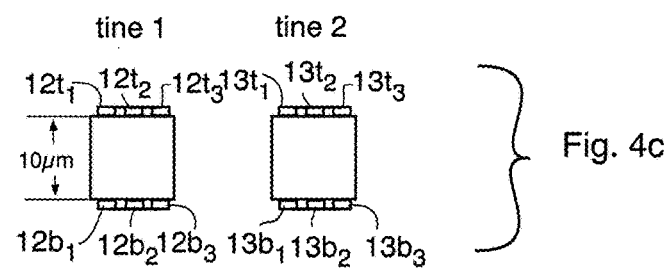
Fig. 4c

1. Starting material: quartz resonator wafer

Fig. 6a

2. Deposit top side electrode and via pad

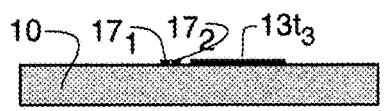
Fig. 6b

3. Starting material: quartz handle wafer

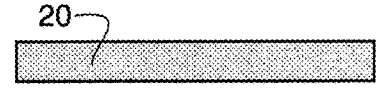
Fig. 6c

4. Deposit temporary adhesive on handle wafer

Fig. 6d

5. Deposit temporary adhesive on quartz resonator wafer

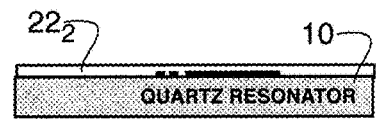
Fig. 6e

6. Bond quartz resonator wafer to handle

Fig. 6f

7. Grind and polish quartz resonator wafer

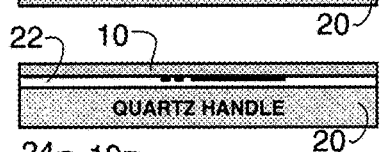
Fig. 6g

8. Deposit metal mask for vias and resonators

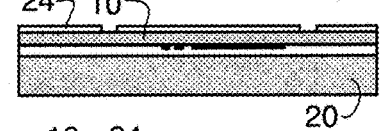
Fig. 6h

9. Etch vias and resonator perimeter

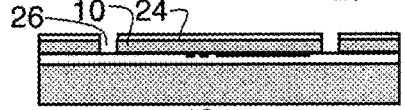
Fig. 6i

10. Deposit via metal as well as bottom side electrodes, via pads and bond pads

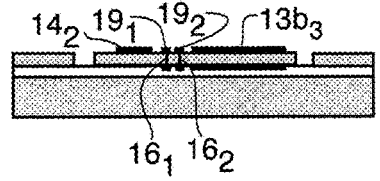
Fig. 6j

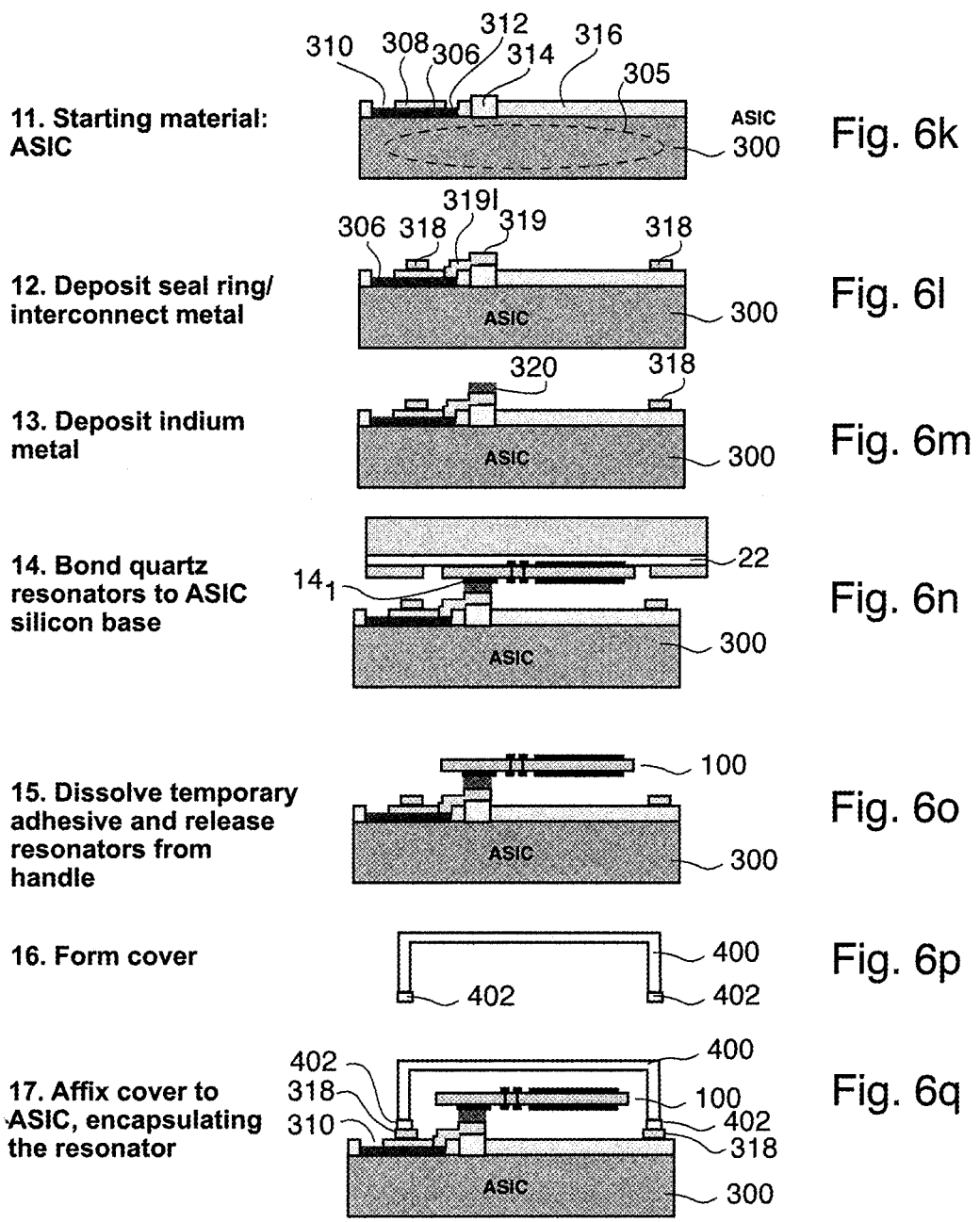

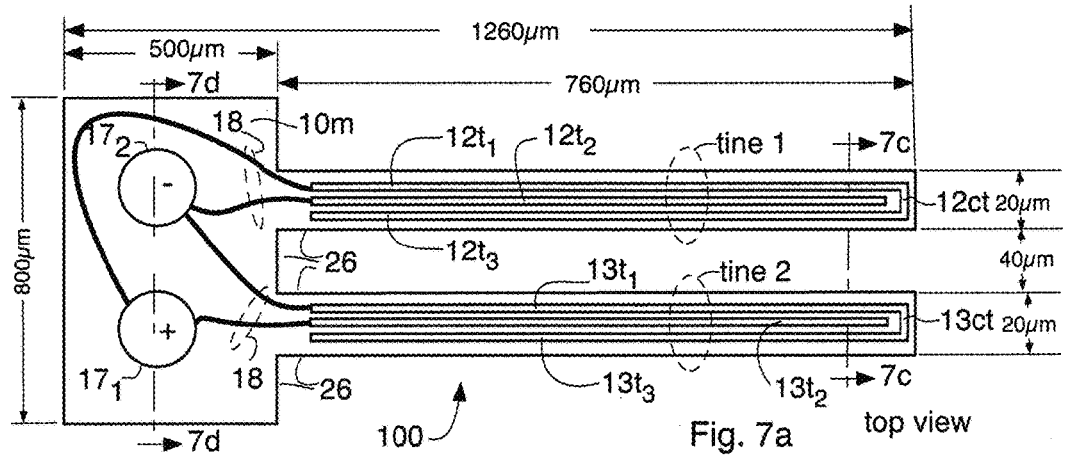
Fig. 7a top view
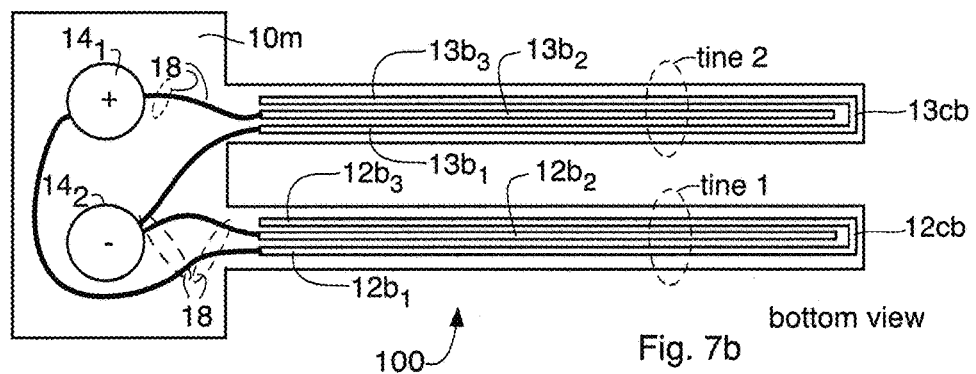
Fig. 7b bottom view
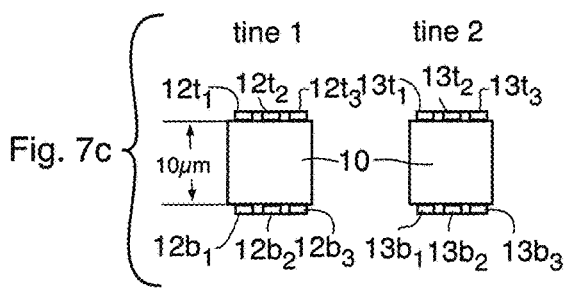
Fig. 7c
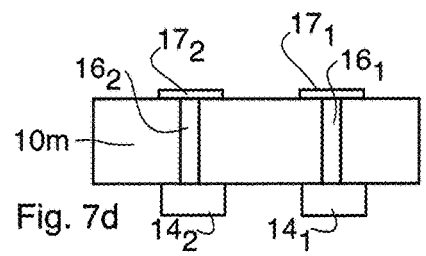
Fig. 7d

INTEGRATED QUARTZ MEMS TUNING FORK RESONATOR/OSCILLATOR

CROSS REFERENCE TO RELATED APPLICATIONS

This application is related to (i) U.S. Pat. No. 7,750,535 issued to Randall L. Kubena et al. on Jul. 6, 2010 and entitled "Quartz-based Nanoresonator" and (ii) U.S. Pat. No. 7,647,688 to David T. Chang et al. on Jan. 19, 2010 and entitled "Method of fabricating a low frequency quartz resonator", the disclosures of these two U.S. patents are hereby incorporated herein by reference.

STATEMENT REGARDING FEDERALLY SPONSORED RESEARCH OR DEVELOPMENT

None

TECHNICAL FIELD

This invention relates to an integrated quartz tuning fork resonator/oscillator which can are preferably made using Micro Electro Mechanical Systems (MEMS) techniques. The disclosed tuning fork mode resonator/oscillator can operate in a kHz frequency range (for example, a kHz range from 10 kHz to 100 kHz) which is a much lower frequency range than found in shear mode resonators/oscillators which operate in a MHz range (typically at HF, VHF or UHF frequencies).

BACKGROUND

In many conventional RF communication and sensor systems, a HF, VHF or UHF signal is generated by a MHz clock for a RF signal of interest. However, energy-efficient microprocessors, consumer electronics, or sensors are typically clocked using a much lower frequency oscillator in the 16-32 kHz range. This saves power since the lower frequency clocks can run with very low power (in the nW to µW range of powers) compared to more moderate power (in the mW range of powers) that is typical for MHz oscillators.

However, resonators operating at such lower frequencies are typically tuning-fork resonators (for which prior art designs are typically 2-10 mm in length) rather than the shear mode slabs used with MHz oscillators. For some applications, where a combination of both analog and digital systems are utilized and time synchronization is critical for the various RF subsystems, e.g., for GPS or inertial navigation applications, the phase noise and jitter of a kHz clock generated by a prior art tuning-fork resonator can reduce the accuracy and increase the power of the overall system. This can be due to frequency drift of the energy-efficient microprocessor's clock between clock cycles requiring more extensive processing during the update for re-synchronization. Thus, resonators for very low power, small, high Q, low phase noise clocks, which can also be easily integrated with other miniaturized components, are needed. This disclosure describes a new method of 1) reducing the size of kHz resonators and clocks, 2) integrating the kHz resonator with electronics on the substrate to form an integrated kHz clock, and 3) integrating the kHz clock with a MHz oscillator on a common semiconductor substrate for highly compact RF system integration. For example, with reference to item 3), a kHz clock (which calls for a kHz oscillator) is used by microprocessors for logic synchronization whereas UHF, VHF or HF oscillators are used for RF analog signal processing. Thus, a kHz frequency oscillator and one or more UHF, VHF or HF oscillators are needed for optimization of the power budgets when both analog and digital signals are present and preferably these oscillators should preferably use fabrication techniques which can be harmoniously used together to realize a single chip having two (or more) oscillators disposed thereon, one of which operates in the kHz frequency range (preferably from 10 to 100 kHz) and another one (or more) which operates in the UHF, VHF or HF frequency range (i.e., at frequencies above 3 MHz).

kHz frequency range quartz tuning fork mode oscillators have been manufactured for years using a combination of wet quartz etching and hybrid packaging in ceramic packages using a free standing plate of quartz 10. See the prior art quart tuning fork of FIGS. 1a-1c. The tuning fork electrodes are deposited on the top (see elements 11t), bottom (see elements 11b), and sides (see elements 11s) of the quartz tines in order to generate the proper lateral electric fields in the Z' cut crystal to obtain extensional motion along the side of the tines. The Z' direction is perpendicular to the plane of the tuning fork crystal. Typically, to obtain a parabolic f/T profile, the Z direction is rotated 0-5° around the X-axis as is depicted by FIG. 2. In order to deposit the side electrodes 11s (which are not shown in FIG. 1a for ease of illustration), a shadow masking technique is utilized after the resonators are etched from a single piece of quartz 10. However, this prior art technique is difficult to implement when a wafer-level process is used and when the quartz resonators are bonded to an underlying handle wafer. When using a handle wafer, it is difficult to cleanly define the side electrodes while obtaining uniform step coverage and no overcoating of handle wafer itself. During the release of the resonators from the handle wafer, any overcoated metal can tear from electrodes 11s on the sidewalls of the tines, thus resulting in a low yield. In addition, using prior art processes, the integration of a kHz clock with other components was not possible.

U.S. Pat. No. 7,750,535 mentioned above relates to a method for integrating a MHz frequency range quartz shear mode resonator to an arbitrary substrate for integrated MHz frequency oscillators and filters. The technology disclosed herein extends this prior art technique by describing a method for integrating a much lower frequency (kHz frequency range) tuning fork resonator using extensional-mode piezoelectric coupling to provide a wafer-scale process for integrated quartz tuning-fork resonator/oscillators. The disclosed resonator is different compared to conventional tuning fork resonators to allow for planar processing of the electrodes on top and bottom of a quartz plate without the need for side electrodes. The new process disclosed herein can be utilized harmoniously with and contemporaneously during a shear-mode fabrication sequence to allow for integration of both MHz shear-mode and kHz tuning-fork mode resonators on the same semiconductor wafer, should that be desired. Additionally, ultra-small kHz resonators can be fabricated with wafer-level processing and also allow for small die sizes. As will be seen, the presently disclosed resonator may have a size of only 1.26 mm long and 0.8 mm wide whereas prior art kHz resonators tend to be 2-10 mm in size.

BRIEF DESCRIPTION OF THE INVENTION

In one aspect, the present invention provides a piezoelectric quartz tuning fork resonator having a pair of tines formed from a common quartz plate, with a middle electrode and two outer electrodes being disposed at or on top and bottom surfaces of each of said pair of tines and interconnected such that the outer electrodes at or on the top and bottom surfaces of a first one of said pair of tines are connected in common with the middle electrodes on the top and bottom surfaces of a second one of said pair of tines and further interconnected such that the outer electrodes at or on the top and bottom surfaces of the second one of said pair of tines are connected in common with the middle electrodes on the top and bottom surfaces of the first one of said pair of tines.

In another aspect, the present invention provides a piezoelectric quartz tuning fork resonator having a pair of tines formed from an integral quartz plate, with metal electrodes formed only on top and bottom major surfaces of said tines and with interconnections disposed on and in said integral quartz plate, whereby when an AC current is applied to said metal electrodes by way of said interconnections, said tines vibrate in response thereto in a tuning fork mode.

In yet another aspect, the present invention provides a method of making a piezoelectric quartz tuning fork resonator which may be integrated on a semiconductor (such as Si) substrate, the method comprising: applying metal forming at least six elongated electrodes to a top side of a quartz substrate; bonding the quartz substrate to a handle wafer; thinning the quartz substrate to a desired thickness; etching two openings or vias through the quartz substrate which openings or vias are filled with metal and the metal in the openings or vias is coupled to said elongated electrodes disposed on the top side of the quartz substrate; etching the quartz substrate so that two elongate tines are defined thereby with three of said six elongated electrodes disposed on each tine thereof; applying metal forming three elongated electrodes to a bottom side of the quartz substrate on each time thereof; applying metal for forming bonding pads on the bottom side of the piezoelectric quartz tuning fork resonator; applying metal for interconnecting the bonding pads, the metal in the openings or vias and the elongated electrodes disposed on the bottom side of the quartz substrate; bonding the etched resonator to said semiconductor substrate; and releasing the resonator from the handle wafer.

BRIEF DESCRIPTION OF THE DRAWINGS

FIG. 3a is a top view of the electrodes of a quartz resonator in accordance with the present invention;

FIGS. 3b and 3c are cross sectional views of the two tines shown in FIG. 3a; the X, Y', and Z' orientation of the quartz crystallography of the two tines is also indicated;

FIGS. 4a and 4b are top and bottom views of one embodiment of a quartz resonator in accordance with the present invention which also show a possible embodiment of the head portion of the quartz resonator where the tuning fork resonator can be conveniently mounted to a substrate preferably bearing integrated circuits to which the electrodes of the quartz resonator mate to form a kHz clock;

FIG. 4c is a cross-sectional view through the tines along section line 4c-4c as shown in FIG. 4a.

FIG. 4d. is a cross-sectional view through the vias in the mounting portion of the quartz plate along section line 4d-4d as shown in FIG. 4a.

FIGS. 6a-6q depict steps which may be used to make and install a tuning fork quartz resonator in accordance with the present invention installed on a semiconductor or chip substrate.

FIGS. 7a and 7b are top and bottom views of a quartz resonator in accordance with the present invention which also show another possible embodiment of the head portion of the quartz resonator where the tuning fork resonator can be conveniently mounted to a substrate preferably bearing integrated circuits to which the electrodes of the quartz resonator mate to form a kHz clock;

FIG. 7c is a cross-sectional view through the tines along section line 7c-7c as shown in FIG. 7a.

FIG. 7d. is a cross-sectional view through the vias in the mounting portion of the quartz plate along section line 7d-7d as shown in FIG. 7a.

DETAILED DESCRIPTION

Figure 1:
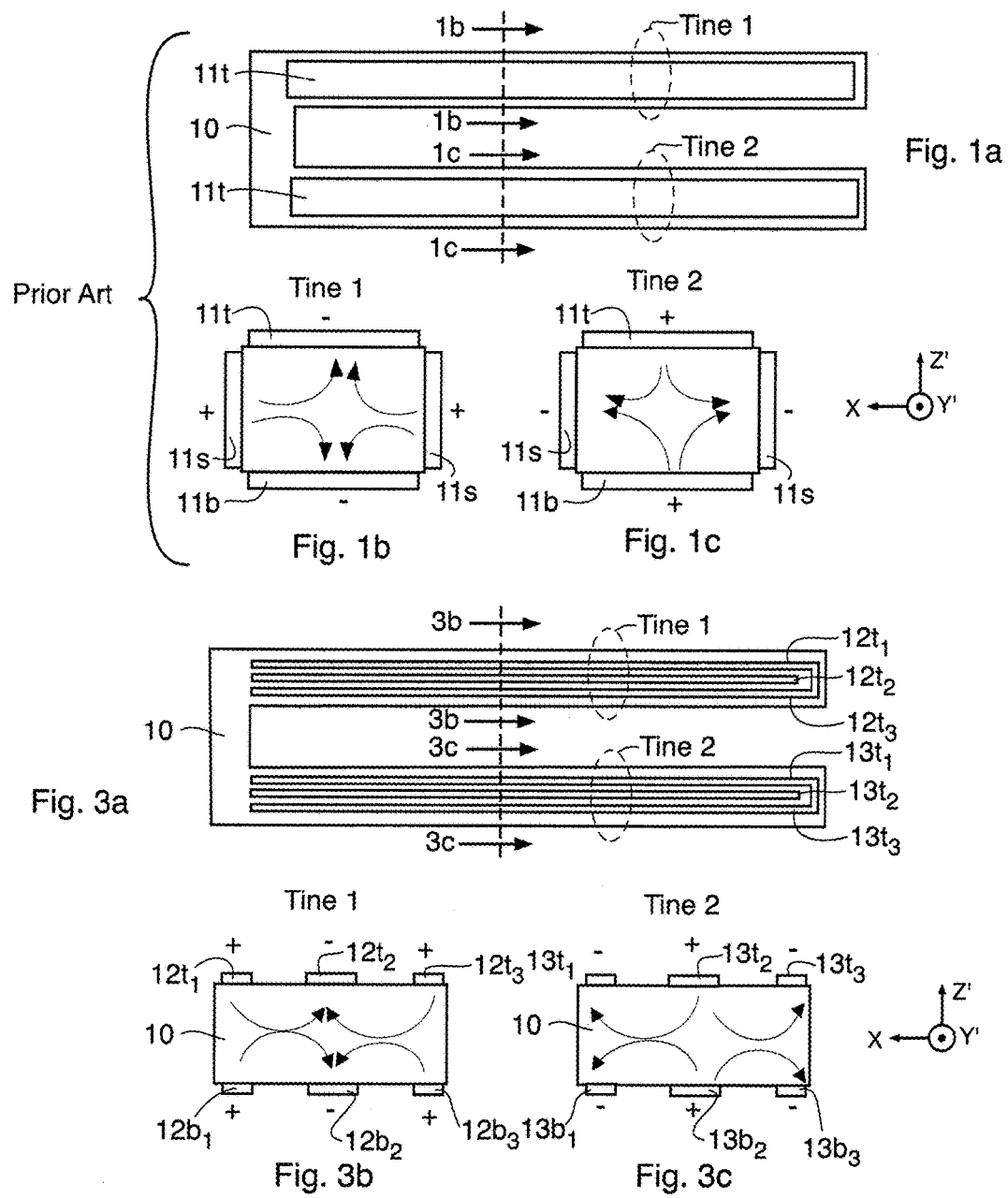
FIG. 1a is a top view of a prior art tuning fork kHz frequency range quartz resonator.
FIGS. 1b and 1c are cross sectional views of the two tines shown in FIG. 1a; the X,Y', and Z' orientation of the quartz crystallography of the two tines is also indicated.

A detailed description follows. Common reference numerals are for multiple embodiments where the reference numerals refer either to identical or nearly identical structure in the various embodiments or to structure which performs identical or very similar functions in the various embodiments.

Figure 2:
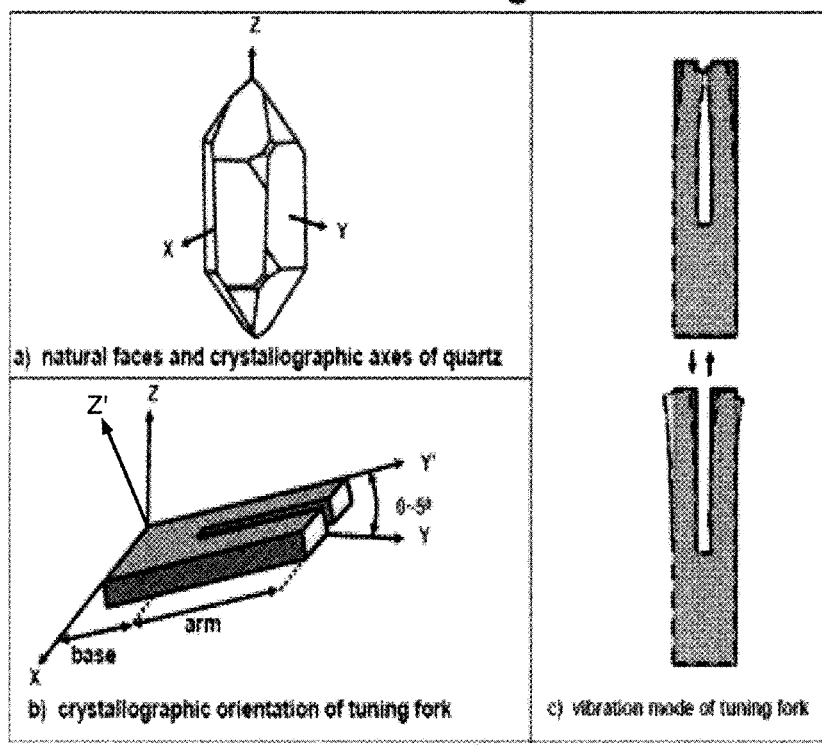
FIG. 2 in parts a) and b) depicts the quartz crystallography of prior art quartz tuning forks, which crystallography is preferably maintained in connection with the present invention; part c) of FIG. 2 depicts the vibration mode of a prior art tuning fork resonator.

For the cut angle shown in part b) of FIG. 2 of quartz (commonly called a Z-cut), the component of the electric field in the +X direction produces a contraction in the dimension in the Y' length of the tines while the component of the electric field in the –X direction produces an extension in the dimension in the Y' length of the tine. Thus, in both the prior art tuning fork resonator of FIGS. 1a-1c and the tuning fork of the present invention as exemplified by the embodiment of FIGS. 3a-3c, a tuning fork vibrational mode is generated for the two tines which reduces acoustical energy loss to the mounts and yields a high Q or quality factor. By fabricating the tines using plasma etching, the dimension thereof can be precisely controlled which is needed to achieve a high Q of 10,000 or more.

The curved lines with arrowheads depicted for the prior art tuning fork tines of FIGS. 1b and 1c show the electric fields imposed when an electrical signal having the instantaneous polarity indicated by the + and − signs occurs on the electrodes 11t, 11b and 11s. Similar line with arrowheads are shown for the tines of the embodiment of the present invention depicted by FIGS. 3b and 3c, showing the electric fields imposed when an electrical signal having the instantaneous polarity indicated by the + (plus) and − (minus) signs occurs on the electrodes $12t_1$, $12t_2$, $12t_3$, $12b_1$, $12b_2$ and $12b_3$ of tine 1 and electrodes $13t_1$, $13t_2$, $13t_3$, $13b_1$, $13b_2$ and $13b_3$ of tine 2. The electric fields occurring in the tines of the prior art tuning fork resonator are very similar to the electric fields occurring in the tines of the tuning fork resonator of the present invention, but there is no need for the difficult-to-manufacture side electrodes to be disposed on the sidewalls of the tines of the tuning fork resonator of the present invention. The tines of the tuning fork resonator of the present invention will vibrate as shown in part c) of FIG. 2 when an AC signal is applied to its electrodes $12t_1$, $12t_2$, $12t_3$, $12b_1$, $12b_2$ and $12b_3$ of tine 1 and electrodes $13t_1$, $13t_2$, $13t_3$, $13b_1$, $13b_2$ and $13b_3$ of tine 2.

Instead of forming electrodes on the sides of the tines as done in the prior art, in the depicted embodiment of the present invention three elongate electrodes $12t_1$, $12t_2$, and $12t_3$ are formed on the top side of tine 1 and three elongate electrodes $13t_1$, $13t_2$, and $13t_3$ are formed on the top side of tine 2. Additionally, three elongate electrodes $12b_1$, $12b_2$, and $12b_3$ are formed on the bottom side of tine 1 while three elongate electrodes $13b_1$, $13b_2$, and $13b_3$ are formed on the bottom side of tine 1. The outermost electrodes $12t_1$ and $12t_3$ on the top side of tine 1 are connected in common preferably by relatively short length of an electrode $12ct$ which is identified on FIG. 4a and which is preferably disposed near a distal end of tine 1. The outermost electrodes $13t_1$ and $13t_3$ on the top side of tine 2 are connected in common preferably by relatively short length of electrode $13ct$ which is identified on FIG. 4a and which is preferably disposed near a distal end of tine 1. Similarly, the outermost electrodes $12b_1$ and $12b_3$ on the bottom side of tine 1 are also connected in common by relatively short length of electrode $12cb$ which is identified on FIG. 4b and which is disposed near the distal remote end of tine 1. And the outermost electrodes $13b_1$ and $13b_3$ on the bottom side of tine 2 are also connected in common by relatively short length of electrode $13cb$ which is identified on FIG. 4b and which is likewise disposed near the distal end of tine 2. The instantaneous polarity of an applied AC signal is shown by the + (plus) and − (minus) signs adjacent the electrodes on FIGS. 3b and 3c.

FIGS. 3a, 3b and 3c depict the tines in some detail, but do not show how the tines of the resonator might be mounted. FIG. 4a is a top view of a tuning fork resonator in accordance with an embodiment 100 of the present invention and it includes a mounting portion 10m of the quartz substrate 10. Similarly, FIG. 4b is a bottom view of the tuning fork resonator in accordance with the embodiment 100 of the present invention and it also depicts the mounting portion 10m of the quart substrate 10. In the bottom view of FIG. 4b two electrically conductive pads $14_1$ and $14_2$ can be seen which are formed on the bottom surface of the quartz plate 10 of resonator 100. These pads $14_1$ and $14_2$ are preferably used both to form electrical connections or bonds between the tuning fork resonator 100 and integrated circuits 305 formed in a chip 300 and to mount the tuning fork resonator 100 mechanically and securely to an upper surface of the chip 300. These pads $14_1$ and $14_2$ also have + (plus) and − (minus) signs on them which follow the instantaneous polarity convention of the other figures. These pads $14_1$ and $14_2$ appear as dashed line circles on FIG. 4a since they do not need to penetrate the quartz plate 10. The electrical connections or bonds are preferably formed using a compression bonding technique to form very low resistance connections with the integrated circuits formed in chip 300 and at the same time securely mount the tuning fork resonator 100 to chip 300.

Figure 4D:
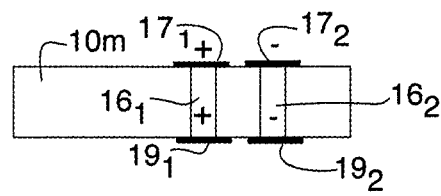

Vias $16_1$ and $16_2$, which do penetrate the quartz plate 10, are also shown on FIGS. 4a, 4b and 4d. The vias $16_1$ and $16_2$ are filled with metal and preferably pads $17_1$ and $17_2$ are also formed (on the top surface of quartz plate 10 preferably before the vias $16_1$ and $16_2$ themselves are formed and filled with metal—see the sectional view of 4d) to provide a connection points between the metal in the vias $16_1$ and $16_2$, respectively, and the depicted conductors 18. Pads $19_1$ and $19_2$ are formed on the bottom surface preferably after the vias $16_1$ and $16_2$ are formed and filled with metal.

Pads $17_1$, $17_2$, $19_1$ and $19_2$ along with vias $16_1$ and $16_2$ are more easily seen in the sectional view of FIG. 4d. The mounting pad $14_2$ is not shown in FIG. 4d for ease of illustration.

Pad $17_1$ and via $16_1$ have a + (plus) sign while pad $17_2$ via $16_2$ have a − (minus) sign which signs follow the instantaneous polarity convention being used in this description. Via $16_1$ and its pads $17_1$ and $19_1$ are ohmically connected by conductors 18 to outermost electrodes $12t_1$ and $12t_3$ of top side of tine 1, to the middle or innermost electrode $13t_2$ on the top side of tine 2, to the outmost electrodes $12b_1$ and $12b_3$ on the bottom side of tine 1 and to the middle or innermost electrode $13b_2$ on the bottom side of tine 2. For the top electrodes, these connections are made directly to via $16_1$ and through the relatively short conductor $12ct$. For the bottom side electrodes, these connections are routed through pad $14_1$ and through the relatively short conductor $12cb$. Other routings of these connections are possible, but we show one possible routing to demonstrate the concept.

Similarly, via $16_2$ and its pads $17_2$ and $19_2$ are ohmically connected by conductors 18 to the outermost electrodes $13t_1$ and $13t_3$ on the top side of tine 2, to middle or innermost electrode $12t_2$ on the top side of tine 1, to outer most electrodes $13b_1$ and $13b_3$ on the bottom side of tine 2 and to the middle or innermost electrode $12b_2$ on the bottom side of tine 1. Again, for the top side electrodes, these connections are made directly to pad $17_2$ and through the relatively short conductor $13ct$. For the bottom side electrodes, these connections are made with mounting pad $14_2$ (with the via as a common starting point) and $13cb$. Other routing of these connections are possible, but we show one possible routing to demonstrate the concept.

The signal applied to the electrodes is preferably a sine wave AC signal. The + (plus) and − (minus) signs just show which electrodes are connected in common and just reflect an instantaneous voltage of the AC signal applied at pads $14_1$ and $14_2$. The pulse signs could be replaced with minus signs and the minus signs could be replaced with plus signs without affecting how the electrodes are wired up.

Other cut angles of quartz could be utilized for the tuning fork 100, such as an AT-cut to optimize the f/T profile for a particular application.

In the embodiment of FIGS. 4a-4d, the vias $16_1$ and $16_2$ are laterally spaced from the bonding pads $14_1$ and $14_2$. However, one or both of the vias $16_1$ and $16_2$ can be located under, with or immediately adjacent bonding pads $14_1$ and $14_2$. See, for example, the embodiment of FIGS. 7a-7d where the vias $16_1$ and $16_2$ are depicted within the outlines of the bonding pads $14_1$ and $14_2$. The embodiment of FIGS. 4a-4d is believed to be superior to the embodiment of FIGS. 7a-7d since by laterally spacing the vias $16_1$ and $16_2$ from the bonding pads $14_1$ and $14_2$ it is believed that the heat and pressure from bonding the resonator to a semiconductor substrate is less likely to disturb the metal in the vias $16_1$ and $16_2$.

FIGS. 4a and 7a include possible dimensions of the tines and other aspects of the depicted embodiment 100 of the kHz tuning fork. These dimensions are merely suggested dimensions of one possible embodiment of the present invention. Other dimensions will prove to be satisfactory. Using an elastic modulus of quartz of 87 GPa and a density of 2.6 g/cm.$^3$, one can calculate that a 20 μm wide tine that is 760 μm long (as shown for the depicted embodiment of FIGS. 4a and 4b) will oscillate at 32 kHz. An appropriate thickness of the quartz plate 10 is about 10 μm for this 32 kHz embodiment. Since three electrodes are necessary for both the top and bottom of each tine, this implies that each electrode $12t_1$, $12t_2$, $12t_3$, $12b_1$, $12b_2$ and $12b_3$ would have a linewidth of no more than approximately 3 µm which easily fits within a 20 µm tine width.

If it were desired that the tuning fork resonator be resonant a 100 kHz, then one needs to make the tines shorter and/or wider. In general, the frequency scales as width/length². So to make a 10 kHz resonator, keeping the width tine the same (at 20 µm), increasing the tine length to 1360 um would be needed. To make a 100 kHz resonator, increasing the width to 40 µm and decreasing the tine length to 608 µm would work.

Each electrode $12t_1$, $12t_2$, $12t_3$, $12b_1$, $12b_2$, $12b_3$, $13t_1$, $13t_2$, $13t_3$, $13b_1$, $13b_2$ and $13b_3$ may have a common linewidth (of for example 3 µm) as suggested above or the center electrodes $12t_2$ and $12b_2$ of tine 1 may be wider than the outermost electrodes $12t1$, $12t_3$, $12b_1$ and $12b_3$ as suggested by FIG. 3b and the center electrodes $13t_2$ and $13b_2$ of tine 2 may be wider than the outermost electrodes $13t1$, $13t_3$, $13b_1$ and $13b_3$ as suggested by FIG. 3c. Additionally, the outermost electrodes $12t1$, $12t_3$, $12b_1$ and $12b_3$ of tine 1 and the outermost electrodes $13t1$, $13t_3$, $13b_1$ and $13b_3$ of tine 2 should be disposed at or very close to (for example, preferably no more than a linewidth away from) the edges of the tines to help maximize the horizontal or lateral component of the electric fields depicted by the lines with arrowheads in FIGS. 3b and 3c.

A linewidth of no more than approximately 3 µm is easily attainable using conventional contact optical lithography. Including the depicted bond pads and vias, this embodiment of a tuning fork resonator would be about 1.26 mm long and 0.8 mm wide as is noted on FIG. 4a. Using higher resolution lithography, either optical or ebeam, would allow the width and lengths of the tines to be reduced for even smaller implementations if that is desired.

The embodiments of FIGS. 4a-4d and FIGS. 7a-7d have elongated electrodes on both major (the top and bottom) surfaces of the tines. However, embodiments with elongated electrodes on only one of the major surfaces (top or bottom) on the tines are certainly possible. Additionally, the elongated electrodes on either or both the major (top and bottom) of the tines surfaces could be reduced or increased in number. For example, turning again to FIGS. 3b and 3c, it should be apparent that the electric fields depicted by the lines with arrowheads would still have a desirable lateral component if certain ones of the depicted electrodes were omitted. As just mentioned, all of the top or all of the bottom electrodes could be omitted, but a lateral electric field component would still occur. That is also true if fewer than all electrodes are omitted from one of the major surfaces. Also, the center electrodes could be limited to just one major (top or bottom) surface while the outermost electrodes could be limited to another major (top or bottom) surface. There are many possible ways of placing the elongated electrodes only on the top and/or bottom major surfaces of the tines (but not on the side surfaces of the tines) and still realize the desired lateral electric field components and thus this discussion is not meant to be exhaustive of all such ways of achieving the desired lateral electric field components.

Figure 5:
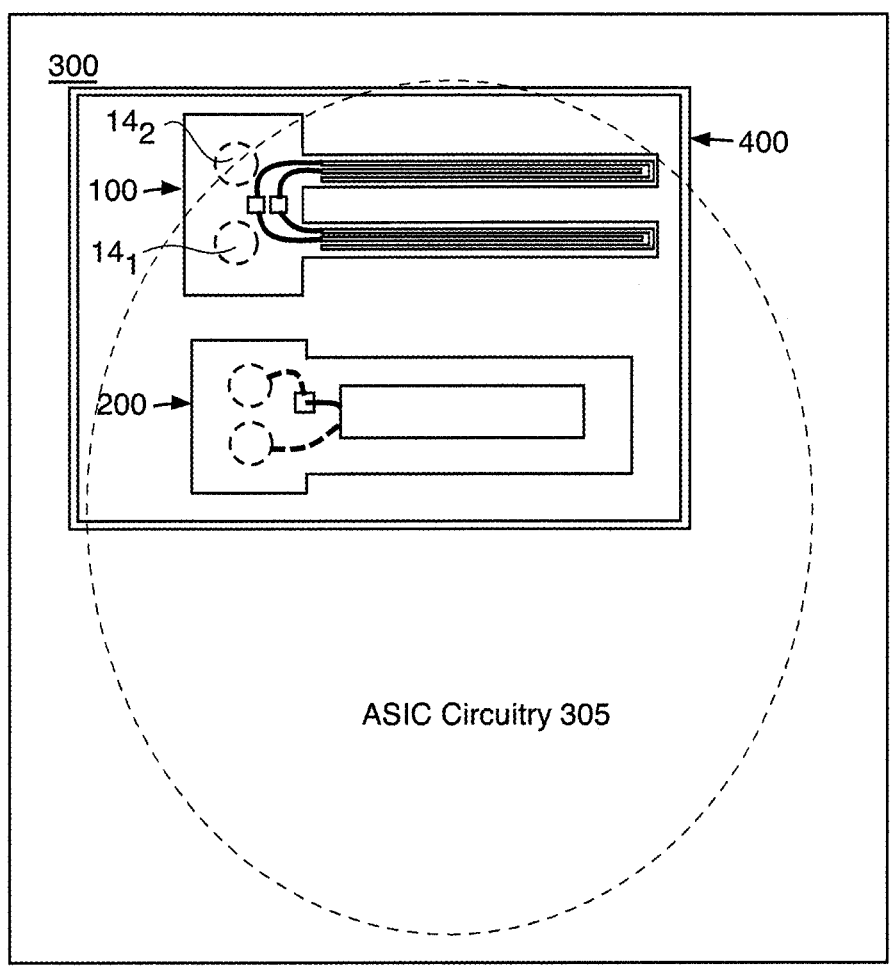
FIG. 5 depicts the tuning fork quartz resonator in accordance with the present invention installed or mounted on a semiconductor or chip substrate along with a HF, VHF or UHF shear mode resonator.

FIG. 5 depicts a tuning fork resonator 100 in accordance with the present invention disposed on (and mated to) a semiconductor substrate or chip 300 (which may be an ASIC) which preferably has a plurality of active circuits 305 embedded in it. FIG. 5 also depicts a HF, VHF or UHF shear type resonator 200 also disposed on (and mated to) the same semiconductor substrate or chip 300. The active circuits in semiconductor substrate or chip 300 preferably includes the electronics needed to allow tuning fork resonator 100 to fix the frequency of a kHz clock and also includes the electronics needed to allow shear mode resonator 200 to fix the frequency of a HF, VHF or UHF clock. The processing preferably used to make and install the tuning fork resonator 100 in accordance with the present invention on semiconductor substrate or chip 300 is described with reference to FIGS. 6a-6q and is similar to the processing used to make and install the HF, VHF or UHF shear type resonator 200 on the semiconductor substrate or chip 300 so that both resonators 100 and 200 may be conveniently formed in parallel (if desired) and installed on a common substrate or chip 300.

Typically the shear type resonator 200 will have a thicker quartz substrate than the quartz substrate of the tuning fork resonator 100 (it could be several times thicker) so the shear type resonator 200 should preferably be installed on semiconductor substrate or chip 300 after the tuning fork resonator 100 of the present invention has been installed thereon to prevent the handle wafer of the shear mode resonator from hitting the previously bonded tuning fork resonator.

The formation and installation of the tuning fork resonator 100 on semiconductor substrate or chip 300 will now be described with reference to FIGS. 6a-6q. In many applications it may well be desirable to mount a kHz tuning fork type resonator 100 as described herein along with a shear type resonator 200 for the reasons mentioned above. The processing described below with reference to FIGS. 6a-6q is sufficiently harmonious with processing used to fabricate a shear type resonator 200 (see U.S. Pat. No. 7,647,688), that both resonators could be fabricated more or less at the same time using different cut-angles for the resonator substrates and handle wafers.

In FIG. 6a the starting material for the tuning fork resonator is shown. The starting material is preferably the quartz plate 10 having a crystallographic orientation (Z-cut) as previously described with reference to FIG. 2. Next, as shown in FIG. 6b, the top side metallization (preferably Au) is deposited and patterned to form the pads $17_1$ and $17_2$ along with electrodes $12t_1$, $12t_2$, $12t_3$, $13t_1$, $13t_2$, and $13t_3$ and interconnects 18 (see also FIG. 4a as only electrode $13t_3$ is easily seen in FIG. 6b).

FIG. 6c depicts a handle wafer 20 which is preferably formed also of quartz material with the same crystallographic orientation as plate 10. Other materials (such as silicon) or other quartz crystallographic orientations may be used for handle wafer 20, if desired, but those materials could pose certain fabrication issues due to differential rates of thermal expansion. So a quartz material having the same crystallographic orientation as plate 10 is preferred for handle wafer 20. A temporary adhesive $22_1$ and $22_2$ is applied to the handle wafer (see FIG. 6d) and to the quartz plate 10 (see FIG. 6e) and the two are temporarily bonded together via the temporary adhesive which becomes a common adhesive layer 22 as is depicted by FIG. 6f.

The handle wafer 20 is used to support quartz plate 10 as it is ground down (see FIG. 6g) and polished to a desired thickness. As previously discussed, the quartz plate 10 may be reduced in a thickness of, for example, 10 µm. Then a mask 24 is applied (the mask 24 is preferably metal) and pattered (see FIG. 6h) to define openings therein through which the quartz plate 10 will be subsequently etched (see the next step depicted by FIG. 6i) to define vias $16_1$ and $16_2$ (the opening therefore are not shown in FIGS. 6h and 6i for ease of illustration, so see FIG. 4d where the vias $16_1$ and $16_2$ can be easily seen) as well as the tuning fork outline shape 26 of the tuning fork resonator as depicted, for example, by FIG. 4a.

As is represented by FIG. 6*j*, the metal mask 24 is removed and the vias $16_1$ and $16_2$ are filled with metal (but the vias $16_1$ and $16_2$ filled with metal are not shown by phantom lines, which would normally be used in this side elevational view—since they are hidden from a direct view—but phantom lines are not used given the limited space and for ease of illustration). Then bottom side metallization (preferably Au) is deposited and patterned to define the metal pads $19_1$ and $19_2$ along with bonding pads $14_1$ and $14_2$, the bottom side electrodes $12b_1$, $12b_2$, $12b_3$, $13b_1$, $13b_2$ and $13b_3$ and interconnects 18 therefor on the bottom surface of plate 10. Only one bonding pad ($14_1$) and one bottom electrode ($13b_3$) can be seen in this side elevational view, but the bonding pads and all the bottom electrodes as well as the interconnects 18 can be seen in FIG. 4*b*).

FIG. 6*k* shows the starting material of the semiconductor substrate or chip 300. The semiconductor material could well be silicon (Si) or another other semi-conductive material, including SiGe and GaAs. Typically, chip 300 would be a Application Specific Integrated Circuit or ASIC. The ASIC preferably include active circuits (represented by a dashed line oval 305) and those active circuits would typically include the electronics used to form a clock controlled by resonator 100 (and also resonator 200 if it is used as well). Chip 300 preferably has two or more buried conductors (metal or a implanted region) 306 which are partially covered by a insulating layer 308 leaving two exposed opening 310 and 312 for each of the two or more buried conductors 306. Pedestal 314 is a raised region (preferably formed of a dielectric material) which will receive metal pads 319 (see FIG. 6*l*) disposed on the pedestal 314 and sized and positioned thereon to mate with the respective bonding pads $14_1$ and $14_2$ on the the bottom side bottom side of resonator 100. Each metal pad 319 also has interconnect metal 3191 (see FIG. 6*l*) to form an ohmic connection with at least one of the buried conductors 306. Layer 316 may be a passivation layer to protect chip 300.

In FIG. 6*l* seal ring metal 318, if used, may be deposited at the same time the interconnect metal 3191 and pad 319 metal are deposited. Indium metal 320 is preferably deposited atop each of the pads 319 (see FIG. 6*m*) and preferably sized and positioned as pads thereon for mating with the respective bonding pads $14_1$ and $14_2$ on the bottom side of resonator 100.

The resonator from FIG. 6*j* is then flipped and compression bonded (preferably by a Au/In eutectic bond) at bonding pads $14_1$ and $14_2$ on the bottom side of resonator 100 to the similarly sized and relatively located pads of indium metal 320 as is shown by FIG. 6*n*. The temporary adhesive is next removed preferably by soaking in a suitable solvent to release the resonator 100 from the handle wafer 20 as is shown at FIG. 6*o*.

If the resonator is to be located in a vacuum cavity, a cover 400 is formed with suitable bonding pads 402 (see FIG. 6*p*). The cover 400 is then located over the chip 200 to encapsulate resonator 100 (and optionally also resonator 200—see FIG. 5) in a vacuum (or other desired atmosphere) and compression bonded thereto at seal ring metal 318. With the cover 400 installed on chip 100, the electrodes on the top and bottom surfaces of the resonator 100 may be accessed electrically via openings 310 externally of the cover 400.

Resonators 100 and 200 may utilize quartz resonator wafers with a common crystallographic orientation (such as AT-cut) thereby allowing resonators 100 and 200 to be formed using common quartz substrates or wafers and using nearly identical processing procedures. Of course, the details need to differ since the quartz of resonator 200 is likely to be several times thicker than the quartz of resonator 100. Their outline shapes differ as do the placement and configuration of their electrodes.

The foregoing description of the disclosed embodiments and the methods of making same has been presented for the purposes of illustration and description. It is not intended to be exhaustive or to limit the invention to the precise form or methods disclosed. Many modifications and variations are possible in light of the above teachings. It is intended that the scope of the invention be limited not by this detailed description or the concepts set forth above, but rather by the claims appended hereto.

What is claimed is:

1. A piezoelectric quartz tuning fork resonator formed of a quartz plate with a pair of tines projecting from of a mounting portion of said quartz plate, each of the pair of tines having top and bottom major surfaces, each of the pair of tines having a middle electrode and two outer electrodes disposed on the top and bottom major surfaces of each of said pair of tines, the pairs of tunes also having side surfaces disposed essentially orthogonally to the top and bottom major surfaces thereof, the side surfaces of said tines having no electrodes disposed thereon, the electrodes on the top and bottom major surfaces of the pair of tines being interconnected such that the outer electrode on the top major surface of a first one of said pair of tines is connected to the outer electrode on the bottom major surface of said first one of said pair of tines by means of a first conductive via penetrating said quartz plate, said first conductive via also being interconnected with the middle electrodes on the top and bottom major surfaces of a second one of said pair of tines, the electrodes on the top and bottom major surfaces of the pair of tines being further interconnected such that the outer electrode on the top major surface of the second one of said pair of tines is connected to the outer electrode on the bottom major surface of said second one of said pair of tines by means of a second conductive via penetrating said quartz plate, said second conductive via also being interconnected with the middle electrodes on the top and bottom major surfaces of the first one of said pair of tines.

2. The piezoelectric quartz tuning fork resonator of claim 1 such that when an alternating electric field is applied, in use, at some instant in time opposing lateral electric fields are produced by the middle electrode of a particular polarity on the top and bottom surfaces of the quartz tines and two outer electrodes on each side of the tines of opposite polarity.

3. The piezoelectric quartz tuning fork resonator of claim 1 wherein the two outer electrodes disposed on the top and bottom major surfaces of each of said pair of tines surrounds the middle electrodes on the top and bottom major surfaces of each of said pair of tines.

4. The piezoelectric quartz tuning fork resonator of claim 3 wherein each outer electrode comprises first, second and third electrode portions, the first and third portions of each each outer electrode paralleling the side surfaces of said tines while the second portion of each each outer electrode paralleling an end tip of each each outer electrode.

5. The piezoelectric quartz tuning fork resonator of claim 4 the first and third electrode portions are each closely spaced to said side surfaces and wherein the second electrode portions are likewise closely spaced to said end tips.

6. The piezoelectric quartz tuning fork resonator of claim 1 wherein the first conductive via is coupled to a first bonding pad disposed adjacent to said first conductive via and wherein the second conductive via is coupled to a second bonding pad disposed adjacent to said second conductive via.

7. The piezoelectric quartz tuning fork resonator of claim 1 wherein the first conductive via also comprises a first bonding pad wherein the second conductive via comprises a second bonding pad.

8. The piezoelectric quartz tuning fork resonator of claim 1 wherein the middle electrode and the two outer electrodes disposed on the top and bottom major surfaces of each of said pair of tines each have a same linewidth.

9. The piezoelectric quartz tuning fork resonator of claim 8 wherein the two outer electrodes are disposed away from, bit no more than a linewidth away from, the side edges of the tines.

* * * * *